United States Patent
Weis (10) Patent No.: US 9,659,929 B2
(45) Date of Patent: May 23, 2017

(54) SEMICONDUCTOR DEVICE WITH ENHANCEMENT AND DEPLETION FINFET CELLS

(71) Applicant: Infineon Technologies Dresden GmbH, Dresden (DE)

(72) Inventor: Rolf Weis, Dresden (DE)

(73) Assignee: Infineon Technologies Dresden GmbH, Dresden (DE)

( * ) Notice: Subject to any disclaimer, the term of this patent is extended or adjusted under 35 U.S.C. 154(b) by 218 days.

(21) Appl. No.: 14/529,322

(22) Filed: Oct. 31, 2014

(65) Prior Publication Data

US 2016/0126243 A1    May 5, 2016

(51) Int. Cl.
*H01L 27/088* (2006.01)
*H01L 27/06* (2006.01)

(52) U.S. Cl.
CPC ...... *H01L 27/0883* (2013.01); *H01L 27/0886* (2013.01); *H01L 27/0629* (2013.01)

(58) Field of Classification Search
None
See application file for complete search history.

(56) References Cited

U.S. PATENT DOCUMENTS

| 8,455,948 B2 | 6/2013 | Weis |
| 8,847,311 B2 | 9/2014 | Meiser et al. |
| 2016/0126243 A1* | 5/2016 | Weis ................... H01L 27/0883 257/392 |

OTHER PUBLICATIONS

Meiser, et al., "Semiconductor Device and Method of Manufacturing a Semiconductor Device", U.S. Appl. No. 13/692,059, filed Dec. 3, 2012, 1-33.
Meiser, et al., "Semiconductor Device Including a Fin and a Drain Extension Region and Manufacturing Method", U.S. Appl. No. 13/692,462, filed Dec. 3, 2012, 1-37.
Meiser, et al., "Semiconductor Device, Integrated Circuit and Method of Forming a Semiconductor Device", U.S. Appl. No. 14/082,491, filed Nov. 18, 2013, 1-49.
Schloesser, et al., "Semiconductor Device and Method for Manufacturing a Semiconductor Device", U.S. Appl. No. 13/627,215, filed Sep. 26, 2012, 1-33.

* cited by examiner

*Primary Examiner* — Jack Chen
(74) *Attorney, Agent, or Firm* — Murphy, Bilak & Homiller, PLLC (57) ABSTRACT

A semiconductor device includes enhancement FinFET cells and depletion FinFET cells. The enhancement FinFET cells include first gate structures separating first semiconductor fins. The depletion FinFET cells include second gate structures separating second semiconductor fins. Between the first and second gate structures a connection structure separates the first semiconductor fins from the second semiconductor fins. The connection structure has a specific conductance which is higher than a specific conductance in the second semiconductor fins.

19 Claims, 8 Drawing Sheets

SEMICONDUCTOR DEVICE WITH ENHANCEMENT AND DEPLETION FINFET CELLS

BACKGROUND

Power semiconductor devices like power MOSFETs (metal oxide semiconductor field effect transistors) withstand a high breakdown voltage in a blocking mode and have a low on-state resistance in a conductive mode. In lateral power MOSFETs a load current flows in a lateral direction parallel to a main surface of a semiconductor die. The lateral current flow imposes area restrictions concerning channel width, gate electrode, drift zone and contacts. Lateral power FinFETs (fin field effect transistors) decrease the on-state resistance by increasing the channel width in a vertical direction. It is desirable to provide lateral power semiconductor devices with improved electrical characteristics.

SUMMARY

According to an embodiment a semiconductor device includes enhancement FinFET cells and depletion FinFET cells. The enhancement FinFET cells include first gate structures separating first semiconductor fins. The depletion FinFET cells include second gate structures separating second semiconductor fins. Between the first and second gate structures a connection structure separates the first semiconductor fins from the second semiconductor fins. The connection structure has a specific conductance which is higher than a specific conductance in the second semiconductor fins.

According to another embodiment a semiconductor device includes enhancement FinFET cells including first gate structures arranged between first semiconductor fins. First depletion FinFET cells include second gate structures which separate second semiconductor fins and which are electrically connected with a source zone of the enhancement FinFET cells. Second depletion FinFET cells include third gate structures which separate third semiconductor fins and which are electrically connected with a source zone of the first depletion FinFET cells.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part thereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
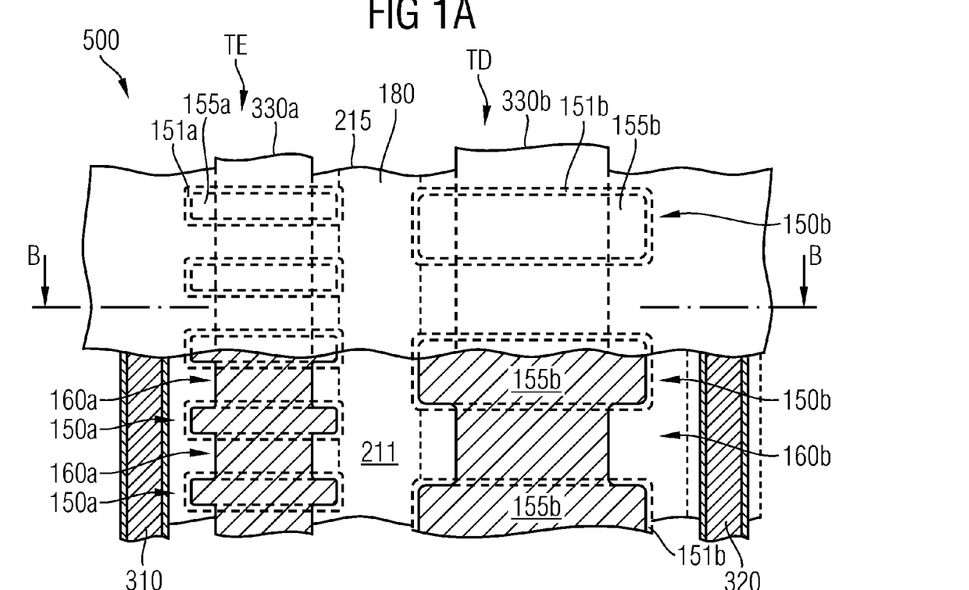
FIG. 1A is a schematic cross-sectional view of a portion of a semiconductor device according to an embodiment providing a connection structure between enhancement FinFET cells and depletion FinFET cells.
Figure 1B:
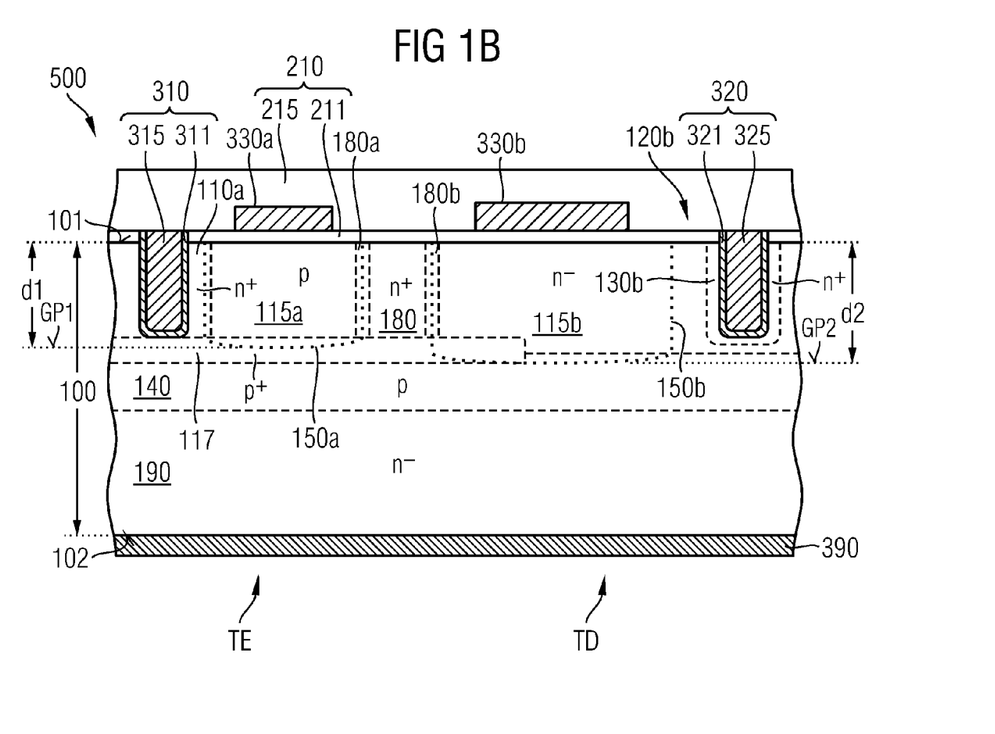
FIG. 1B is a schematic cross-sectional view of the semiconductor device portion of FIG. 1A along line B-B.

FIGS. 1A and 1B refer to a lateral power semiconductor device 500 including enhancement FinFET cells TE and depletion FinFET cells TD.

A semiconductor portion 100 of the semiconductor device 500 is based on a single-crystalline semiconductor material, for example silicon Si, silicon carbide SiC, germanium Ge, a silicon germanium crystal SiGe, gallium nitride GaN or gallium arsenide GaAs. A first surface 101 and an opposite second surface 102 of the semiconductor portion 100 are parallel to each other. Directions parallel to the first surface 101 are lateral directions and a normal to the first surface 101 defines a vertical direction.

The semiconductor portion 100 may include an n doped or p doped base layer 190 directly adjoining the second surface 102. The base layer 190 may be or may include a dielectric layer, for example a silicon oxide layer or a glass layer. According to the illustrated embodiment the base layer 190 is a lightly n doped semiconductor layer. The base layer 190 is optional and can be absent as well. An optional metal-containing substrate layer 390 may directly adjoin the second surface 102.

The enhancement FinFET cells TE include first gate structures 150a arranged between first semiconductor fins 160a formed from protruding sections of the semiconductor portion 100 between the first gate structures 150a. The first gate structures 150a extend from a plane spanned by the first surface 101 at a front side into the semiconductor portion 100 down to a first ground plane GP1 at a first distance d1 to the first surface 101. Longitudinal axes of the first gate structures 150a as well as longitudinal axes of the first semiconductor fins 160a are parallel to a first lateral direction.

The first gate structures 150a may be regularly arranged adjacent to each other in a column extending along a second lateral direction perpendicular to the first lateral direction at a regular center-to-center distance (pitch). The pitch of the first gate structures 150a may be between 50 nm and 1000 nm, e.g., between 100 nm and 250 nm. A width of the first gate structures 150a along the second lateral direction may be between 50 nm and 200 nm, by way of example.

Each first gate structure 150a includes a portion of a conductive first gate electrode 155a. A first gate wiring line 330a may be arranged above the first surface 101, runs along the second lateral direction and connects the portions of the first gate electrode 155a.

The first gate structures 150a further include first gate dielectrics 151a dielectrically separating the first gate electrodes 155a at least from body zones 115a formed in portions of the first semiconductor fins 160a. The first gate dielectrics 151a may completely insulate the first gate electrodes 155a and the first gate wiring line 330a from the semiconductor portion 100. According to other embodiments further insulator structures which differ from the first gate dielectrics 151a in at least one of composition and thickness may be formed along end faces of the first gate structures 150a as well as along the first ground plane GP1. The first gate dielectrics 151a may also separate the body zones 115a from the first gate wiring 330a such that portions of the first gate wiring 330a above the first semiconductor fins 160a are effective as further portions of the first gate electrode 155a.

The depletion FinFET cells TD include second gate structures 150b arranged between second semiconductor fins 160b formed from protruding sections of the semiconductor portion 100 between the second gate structures 150b. The second gate structures 150b extend from a plane spanned by the first surface 101 into the semiconductor portion 100 down to a second ground plane GP2 at a second distance d2 to the first surface 101. The first and second distances d1, d2 may be equal. According to an embodiment, the second distance d2 exceeds the first distance d1 by at most 10%. Longitudinal axes of the second gate structures 150b as well as longitudinal axes of the second semiconductor fins 160b are parallel to the first lateral direction.

The second gate structures 150b may be regularly arranged adjacent to each other in a column extending along the second lateral direction at a regular pitch. Width and pitch of the second gate structures 150b may be equal, smaller or greater than the widths and pitches of the first gate structures 150a.

Each second gate structure 150b includes a portion of a conductive second gate electrode 155b. A second gate wiring line 330b may be arranged above the first surface 101, runs along the second lateral direction and connects the portions of the second gate electrode 155b.

The second gate structures 150b further include second gate dielectrics 151b dielectrically separating the second gate electrodes 155b and the second gate wiring line 330b at least from channel zones 115b formed in the second semiconductor fins 160b. The second gate dielectrics 151b may completely insulate the second gate electrodes 155b and the second gate wiring line 330b from the semiconductor portion 100. According to other embodiments further insulator structures, which differ from the second gate dielectrics 151b in at least one of composition and thickness, may be formed at least at one end face of the second gate structures 150b and/or along the second ground plane GP2. The second gate dielectric 151b may separate the channel zones 115b from the second gate wiring line 330b such that portions of the second gate wiring line 330b above the second semiconductor fins 160b are effective as further portions of the second gate electrode 150b.

The first and second buried gate electrodes 150a, 150b as well as the first and second gate wirings 330a, 330b may be formed from the same or from different conductive materials. According to an embodiment, the first and second gate electrodes 150a, 150b as well as the first and second gate wirings 330a, 330b may consist of or may contain a portion of heavily doped polycrystalline silicon. According to other embodiments, the first and second gate electrodes 150a, 150b and/or the first and second gate wiring lines 330a, 330b may include a metal-containing portion, e.g., a metal silicide layer, a layer containing titanium or tantalum, and/or a layer containing tungsten W, aluminum Al or copper Cu, by way of example.

The first and second gate dielectrics 151a, 151b may differ as regards configuration, material composition and thickness or may be provided from the same materials in the same configuration at the same thickness. Each of the first and second gate dielectrics 151a, 151b or both may consist of or contain a semiconductor oxide layer, e.g., a thermally grown silicon oxide, a deposited silicon oxide layer, for example a silicon oxide using TEOS (tetraethyl orthosilicate) as precursor material, a silicon nitride layer or a silicon oxynitride layer.

The first semiconductor fins 160a include body zones 115a of a second conductivity type complementary to a first conductivity type of source and drain zones defined below.

While in the illustrated embodiments the first conductivity type is n-type and the FinFET cells TE, TD are re-channel FinFET cells, equivalent considerations apply to embodiments with the first conductivity type being p-type and the FinFET cells TE, TD being n- or p-channel FinFET cells.

The enhancement FinFET cells TE further include a source zone 110a of the first conductivity type. First portions of the source zones 110a extend along first end faces of the first gate structures 150a averted from the second gate structures 150b along the first lateral direction. Second portions of the source zone 110a may extend into the first semiconductor fins 160a and may overlap with the first gate electrodes 155a. Pn junctions between the source zone 110a and the body zones 115a of the enhancement FinFET cells TE extend within the first semiconductor fins 160a in a plane vertical to the first surface 101.

The second semiconductor fins 160b include channel zones 115b of the depletion FinFET cells TD and have the conductivity type of the source zones 110a. The channel zones 115b are separated from further regions of the first conductivity type outside the second semiconductor fins 160b.

A drain zone 130b of the depletion FinFET cells TD has the first conductivity type and extends along the second lateral direction at a side of the second gate structures 150b averted from the first gate structures 150a. The drain zone 130b may be formed at a distance to the second semiconductor fins 160b, may directly adjoin the second semiconductor fins 160b or may extend into the second semiconductor fins 160b. A mean net impurity concentration in the drain zone 130b is at least ten times as high as a mean net impurity concentration in the channel zone 115b and is sufficiently high to form an ohmic contact with a material of a metal-containing contact stripe.

A source contact stripe 310 extends from a plane spanned by the first surface 101 into the semiconductor portion 100 and directly adjoins the source zone 110a on a side averted from the first gate structures 150a. A drain contact stripe 320 may extend from the front side into the semiconductor portion 100 and directly adjoins the drain zone 130b at a side averted from the second gate structures 150b.

The source and drain contact stripes 310, 320 may have the same configuration. For example, the source contact stripe 310 may include a first barrier liner 311 and the drain contact stripe 320 may include a second barrier liner 321, wherein both barrier liners 311, 321 directly adjoin the semiconductor portion 100, and have a thickness of 1 nm to 50 nm and may consist of or contain a silicide, cobalt Co, titanium Ti, titanium nitride TiN, tantalum Ta, or tantalum nitride TaN, by way of example.

The source contact stripes 310 may include a first fill portion 315 and the drain contact stripe 320 may include a second fill portion 325 filling the cross-sectional area of the respective contact stripe 310, 320 within the respective barrier layer 311, 321. The material of the fill portions 315, 325 may be tungsten W, by way of example. According to other embodiments, the source and drain contact stripes 310, 320 may include a layer of heavily doped polycrystalline silicon and a metal-containing layer, for example a silicide.

A continuous parting layer 140 of the second conductivity type may be formed between the body and channel zones 115a, 115b on one side and the base layer 190 on the other side. Depending on the doping a p-n-junction between the parting layer 140 and the base layer 190 extends parallel to the first and second surfaces 101, 102.

A heavily doped buried body contact zone 117 of the second conductivity type provides an ohmic contact between the source contact stripe 310 and the body zones 115a. According to other embodiments, the buried body contact zone 117 may also directly adjoin the channel zones 115b. Along the vertical direction, the buried body contact zone 117 may be arranged between the source zone 110a and the parting zone 140, wherein the source contact stripe 310 may extend into the buried body contact zone 117.

Both the source contact stripe 310 and the drain contact stripe 320 may be assigned to a further transistor cell arrangement including enhancement FinFET cells TE and depletion FinFET cells TD arranged mirror-inverted with respect to central vertical axes of the source contact stripe 310 and/or the drain contact stripe 320.

A dielectric structure 210 directly adjoins the first surface 101. The dielectric structure 210 may consist of or contain a thermally grown semiconductor oxide layer, for example a silicon oxide layer, and/or one or more deposited layers, for example a deposited silicon oxide layer or a doped or an undoped silicate glass layer. For example, the dielectric structure 210 includes a first layer 211 of thermally grown semiconductor oxide and an interlayer dielectric 215 that may contain at least one layer formed from a silicate glass, for example PSG (phosphorus silicate glass), BSP (boron silicate glass), or BPSG (boron phosphorus silicate glass). The first layer 211 may correspond to the first and second gate dielectrics 151a, 151b as regards material, configuration and thickness and may be formed contemporaneously with the gate dielectrics 151a, 151b.

The semiconductor device 500 further includes a connection structure 180 between the first gate structures 150a at one side and the second gate structures 150b at the other side. The connection structure 180 separates the first semiconductor fins 160a from the second semiconductor fins 160b. A vertical extension of the connection structure 180 may be greater than a vertical extension of the first semiconductor fins 160a. A specific conductance of the connection structure 180 is higher than in the second semiconductor fins 160b. For example, the connection structure 180 may include a metal-containing stripe extending from the first surface 101 into the semiconductor portion 100.

According to another embodiment the connection structure 180 is or includes heavily doped zones of the first conductivity type, wherein a mean net impurity concentration in the heavily doped zones of the connection structure 180 is at least ten times, for example at least hundred times, as high as in the channel zones 115b. According to an embodiment, the doped connection in the heavily doped zones is sufficiently high to form an ohmic contact with a metal connection structure 180. Heavily doped portions of the connection structure 180 directly adjoining the body zones 115a are effective as drain zones 180a of the enhancement FinFET cells TE and heavily doped portions directly adjoining the channel zones 115b are effective as source zones 180b of the depletion FinFET cells TD.

The connection structure 180 shields the first gate electrode 155a against a potential applied at the drain contact stripe 320 and reduces an overall gate-to-drain capacity $C_{GD}$. In addition, the connection structure 180 facilitates a direct channel zone contact for the depletion FinFET cells TD, the arrangement of diodes parallel to the enhancement FinFET cells as well as parallel to the depletion FinFET cells, respectively, and a cascode configuration of the enhancement and depletion FinFET cells TE, TD.

Figure 2:
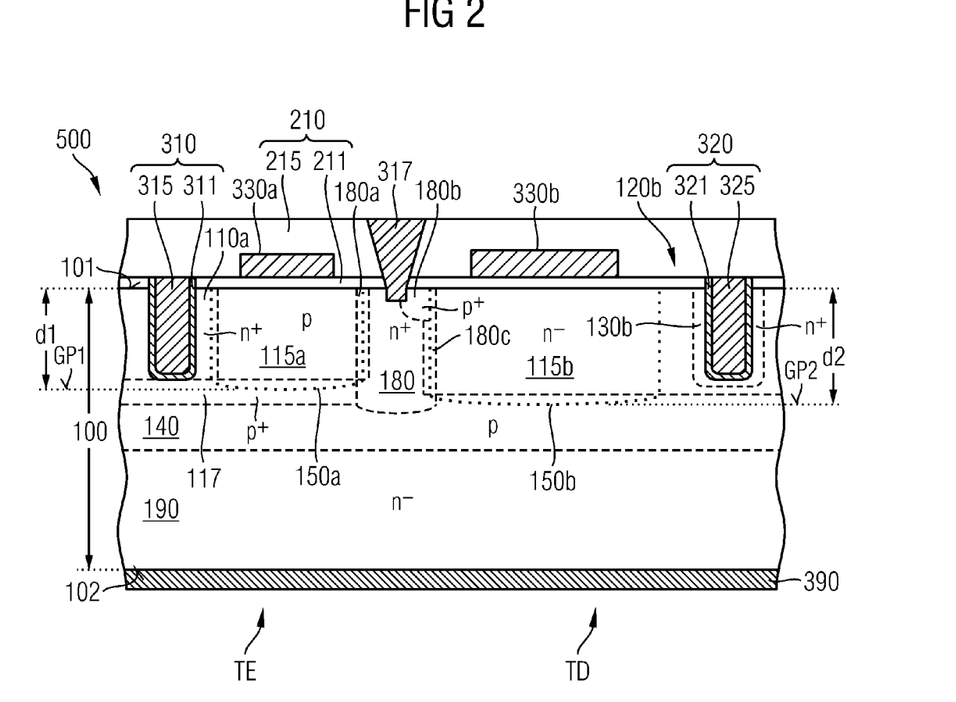
FIG. 2 is a schematic cross-sectional view of a portion of a semiconductor device in accordance with an embodiment providing channel contact zones for depletion FinFET cells.

FIG. 2 refers to direct channel contact zones 180c along the surface of the connection structure 180. The buried body contact zone 117 may be absent in the area of the depletion FinFET cells TD. Instead, the connection structure 180 includes heavily doped channel contact zones 180c of the second conductivity type formed as shallow wells extending from the first surface 101 into the rest of the connection structure 180. The channel contact zones 180c are separated from the parting layer 140 as well as from the buried body contact zone 117 and directly adjoin the channel zones 115b at least in a region where minority charge carriers accumulate in the conductive state.

According to the illustrated embodiment each channel contact zone 180c directly adjoins one of the second gate structures 150b and drains off minority charge carriers which accumulate along the vertical sidewalls of the respective second gate structure 150b when the second gate electrode 155b is biased for the conductive mode of the depletion FinFET cells TD. For example, for n-channel depletion FinFET cells TD the channel contact zones 180c drain off holes accumulated in the conductive state along the vertical sidewalls of the channel zones 115b when the second gate electrode 155b is negatively biased with respect to the channel zones 115b.

According to other embodiments, a contiguous channel contact zone 180c may extend along the second lateral direction. One or more channel contact structures 317 may extend through the dielectric structure 220 down to or into the connection structure 180 and may directly adjoin both the channel contact zones 180c and a portion of the connection structure 180 having the first conductivity type. According to other embodiments one single contact structure 317 extends along the second lateral direction and connects a contiguous stripe-shaped channel contact zone 180c or a plurality of spatially separated channel contact zones 180c. For further details reference is made to the detailed description of FIGS. 1A to 1B.

An electric connection of the channel zones 115b through the channel contact zones 180c has a lower resistance than a connection of the channel zones 115b through the buried body contact zone 117 as illustrated in FIG. 1B.

Figure 3:
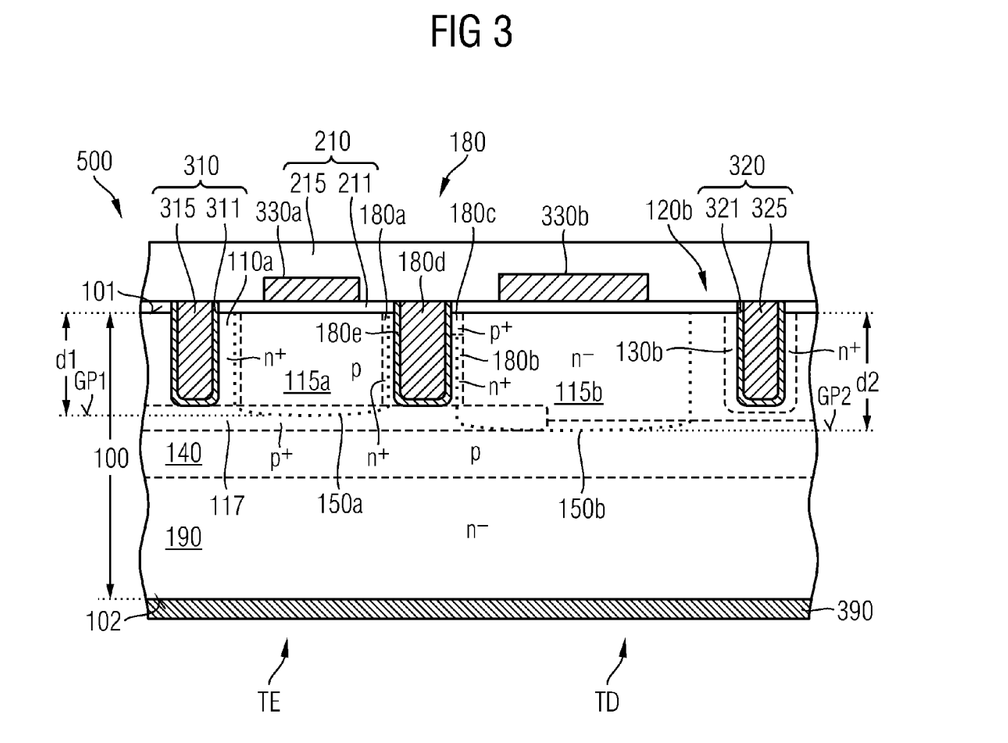
FIG. 3 is a schematic cross-sectional view of a portion of a semiconductor device in accordance with an embodiment providing a connection structure including a metal fill portion.

The semiconductor device 500 of FIG. 3 includes a connection structure 180 including a barrier liner 180e and a metal fill portion 180d. The barrier liner 180e may have the same configuration as the first and second barrier liners 311, 321. The fill portion 180d may be based on the same materials and may have the same configuration as the first and second fill portions 315, 325 of the source and drain contact stripes 310, 320. The connection structure 180 further includes a first heavily doped semiconductor zone of the first conductivity type forming pn junctions with the body zones 150a and being effective as drain zones 180a of the enhancement FinFET cells TE as well as a second heavily doped semiconductor zone of the first conductivity type being effective as the source zone 180b of the depletion FinFET cells TD. For further details reference is made to the detailed description of FIGS. 1A, 1C and 2.

The metal containing portions 180e, 180d of the connection structure 180 may be formed contemporaneously with the source and drain contact stripes 310, 320 and reduce the resistance to other devices electrically connected to the enhancement and depletion FinFET cells TE, TD.

Figure 4A:
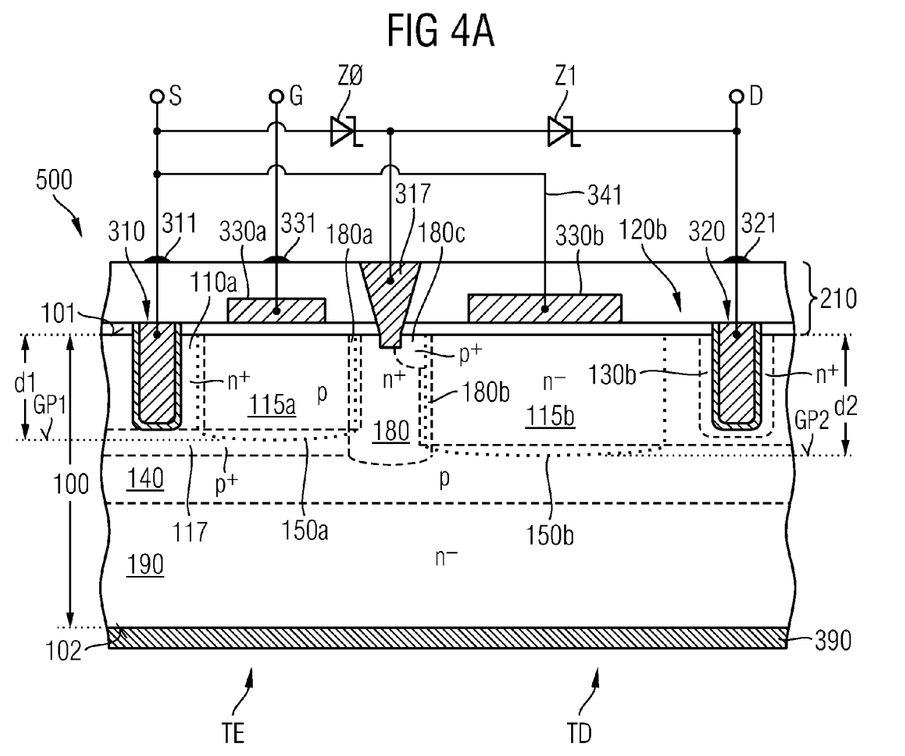
FIG. 4A is a schematic cross-sectional view of a portion of a semiconductor device according to an embodiment providing enhancement FinFET cells and depletion FinFET cells arranged in a cascode configuration.
Figure 4B:
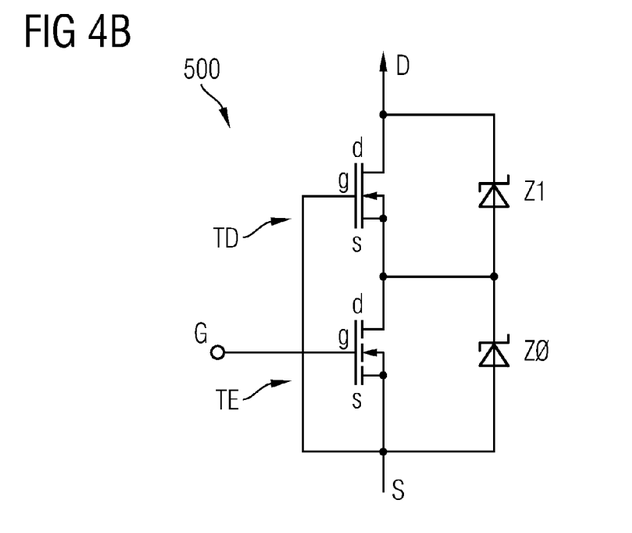
FIG. 4B is a schematic circuit diagram of the semiconductor device of FIG. 4A.

The semiconductor device 500 of FIGS. 4A to 4B is based on one of the semiconductor devices described in detail with reference to the previous Figures. The semiconductor device 500 may be a power semiconductor switching device.

The source contact stripes 310 are electrically connected to a source electrode 311 which may be formed on or above the dielectric structure 210. The source electrode 311 may form or may be electrically connected to a source terminal S of the semiconductor device 500. The drain contact stripe 320 is electrically connected to a drain electrode 321 which may be arranged on or above the dielectric structure 210. The drain electrode 321 may form or may be electrically connected to a drain terminal D. The first gate wiring lines 330a may be electrically connected with a gate pad 331 which may be formed on or above the dielectric structure 210. The gate pad 331 may form or may be electrically connected to a gate terminal G of the semiconductor device 500. A transistor wiring 341 electrically connects the second gate wiring line 330b with the source electrode 311.

The semiconductor device 500 may further include Zener or Avalanche diodes Z0 and Z1 or any other device or voltage limiting element, which can limit an applied voltage to a certain value. A first electrode at a first voltage limiting element, e.g., an anode of a first Zener diode Z0 is electrically connected to the source electrode 311. A second electrode of the first voltage limiting element, e.g., a cathode of the first Zener diode Z0 and a first electrode of a second voltage limiting element, e.g., an anode of a second Zener diode Z1 are electrically connected to the connection structure 180, for example through the contact structure 317. The second electrode of the second voltage limiting element, e.g., a cathode of the second Zener diode Z1, is electrically connected to the drain terminal D.

In the semiconductor device 500 the enhancement FinFET cells TE and the depletion FinFET cells TD are arranged in a cascode arrangement as illustrated in FIG. 4B. In the following the mode of operation of the semiconductor device 500 is described for n-channel enhancement and depletion FinFET cells TE, TD with the first conductivity type being the n-type. Equivalent considerations apply for embodiments with the first conductivity type being the p-type providing p-channel enhancement and depletion FinFET cells TE, TD.

In a conductive mode of the semiconductor device 500 a positive potential applied to the gate terminal G induces an n-type inversion channel through the body zones 115a of the enhancement FinFET cells TE, thereby switching the source potential applied to the source contact stripes 310 to the connection structure 180 on the drain side of the enhancement FinFET cells TE. The same potential is applied to the second gate electrodes 155b of the depletion FinFET cells TD through the transistor wiring 341. When the gate potential applied to the second gate electrodes 150b is equal to the source potential of the depletion FinFET cells TC, the depletion FinFET cells TD are conductive and switch the potential at the connection structure 180 to the drain contact stripe 320.

When the potential at the gate terminal G falls below the threshold voltage of the enhancement FinFET cells TE the enhancement FinFET cells TE block and the connection structure 180 takes a positive potential applied by the circuit environment through the drain terminal D to the connection structure 180. Since the second gate electrodes 150b of the depletion FinFET cells TD are pinned to the source potential which is lower than the potential of the connection structure 180 the gate potential of the depletion FinFET cells TD falls below the threshold voltage and the depletion FinFET cells TD change to the blocking state. The channel zones 115b in the depletion FinFET cells TD deplete, wherein the mobile negative charge carriers (electrons) are drained-off from the channel zones 115b leaving positively charged stationary impurity ions. The negatively biased second gate electrodes 150b may compensate the remaining positive charge in the channel zones 115b such that the depletion FinFET cells TD have a high blocking voltage capability even at comparatively high impurity concentrations in the channel zones 115b, wherein the high impurity concentration in the channel zones 115b decreases the on-state resistance as well as the static losses of the semiconductor device 500.

The blocking capability of the semiconductor device 500 may be scaled by varying the number of depletion FinFET cells TD arranged in series between the connection structure 180 and the drain contact stripe 320. The blocking voltage is accommodated in a lateral direction such that scaling the blocking capability avoids comparatively expensive and time-consuming grinding and CMP (chemical mechanical polishing) processes. The first and second Zener diodes Z0, Z1 may protect the enhancement and depletion FinFET cells TE, TD against overvoltage conditions.

While in conventional power FinFETs the gate-to-channel voltage increases with each stage resulting in an increasing minimum gate dielectric thickness, in the semiconductor devices 500 according to the embodiments the same gate-to-channel voltage, for example 20V, may be accommodated in each stage, wherein the required minimum gate dielectric thickness is the same for all stages. The semiconductor device 500 embodies an ADZFET (active drift zone FET) on the basis of lateral FinFET concepts.

Figure 5A:
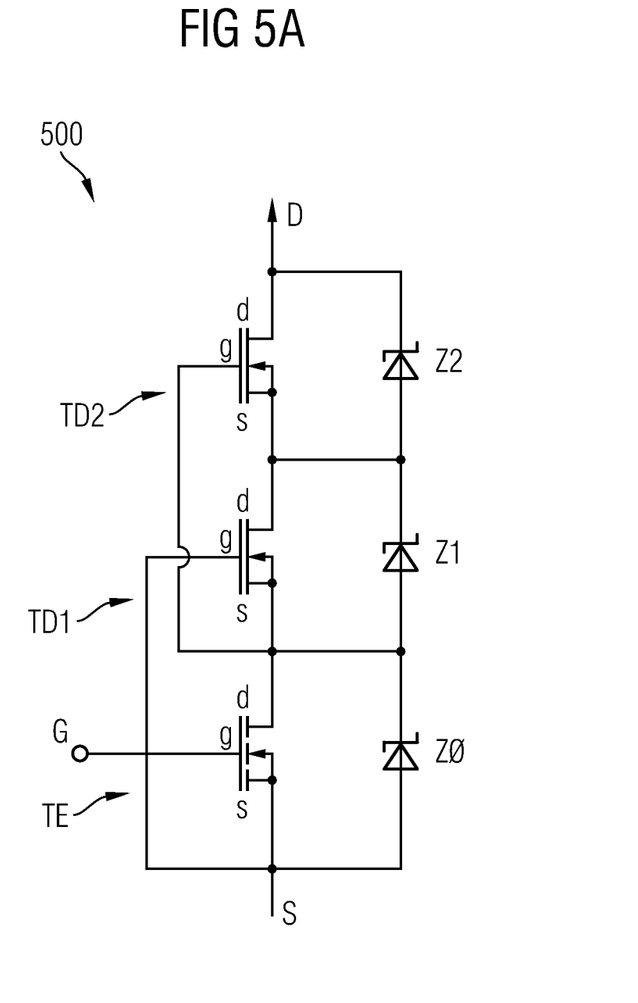
FIG. 5A is a circuit diagram of a semiconductor device in accordance with an embodiment concerning a cascode configuration with two depletion FinFET cells.
Figure 5B:
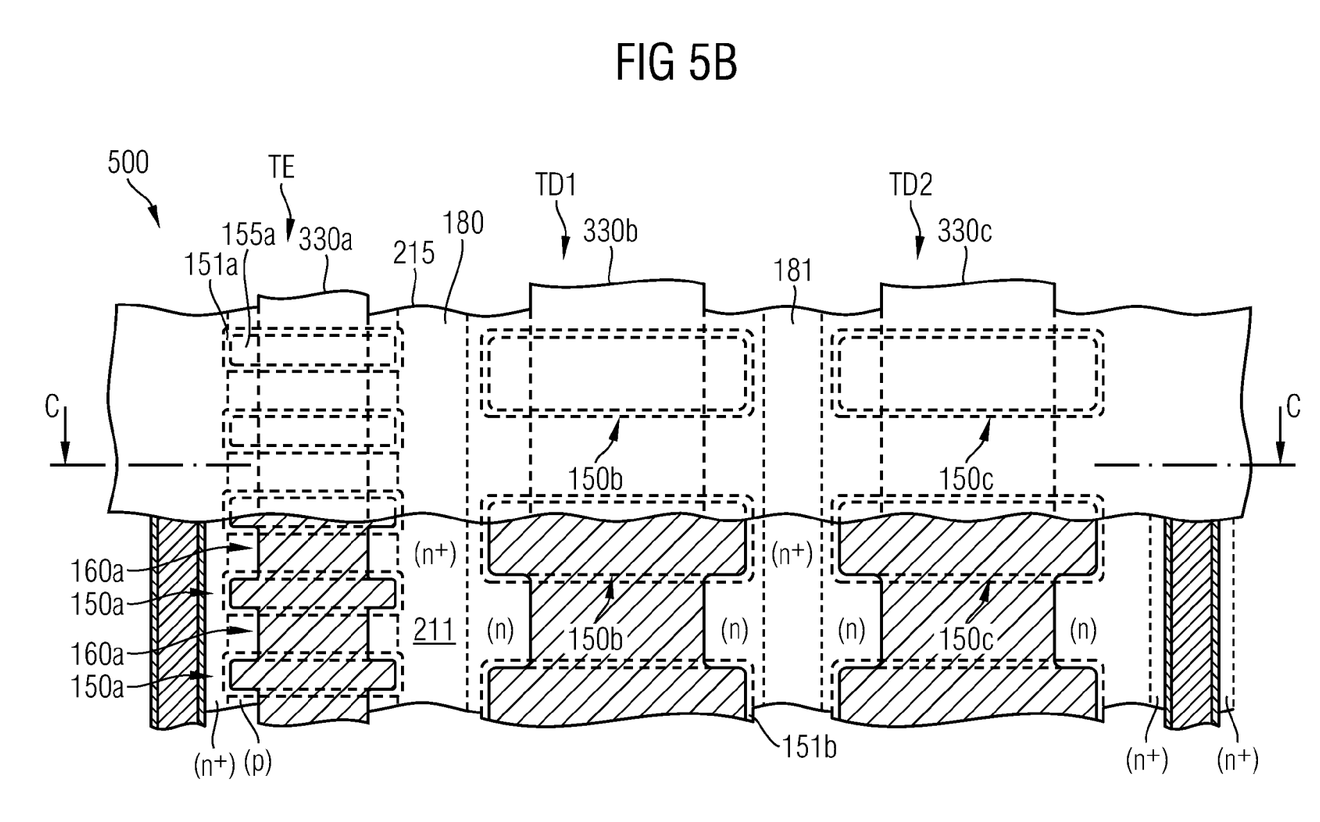
FIG. 5B is a schematic plan view of a portion of the semiconductor device of FIG. 5A.
Figure 5C:
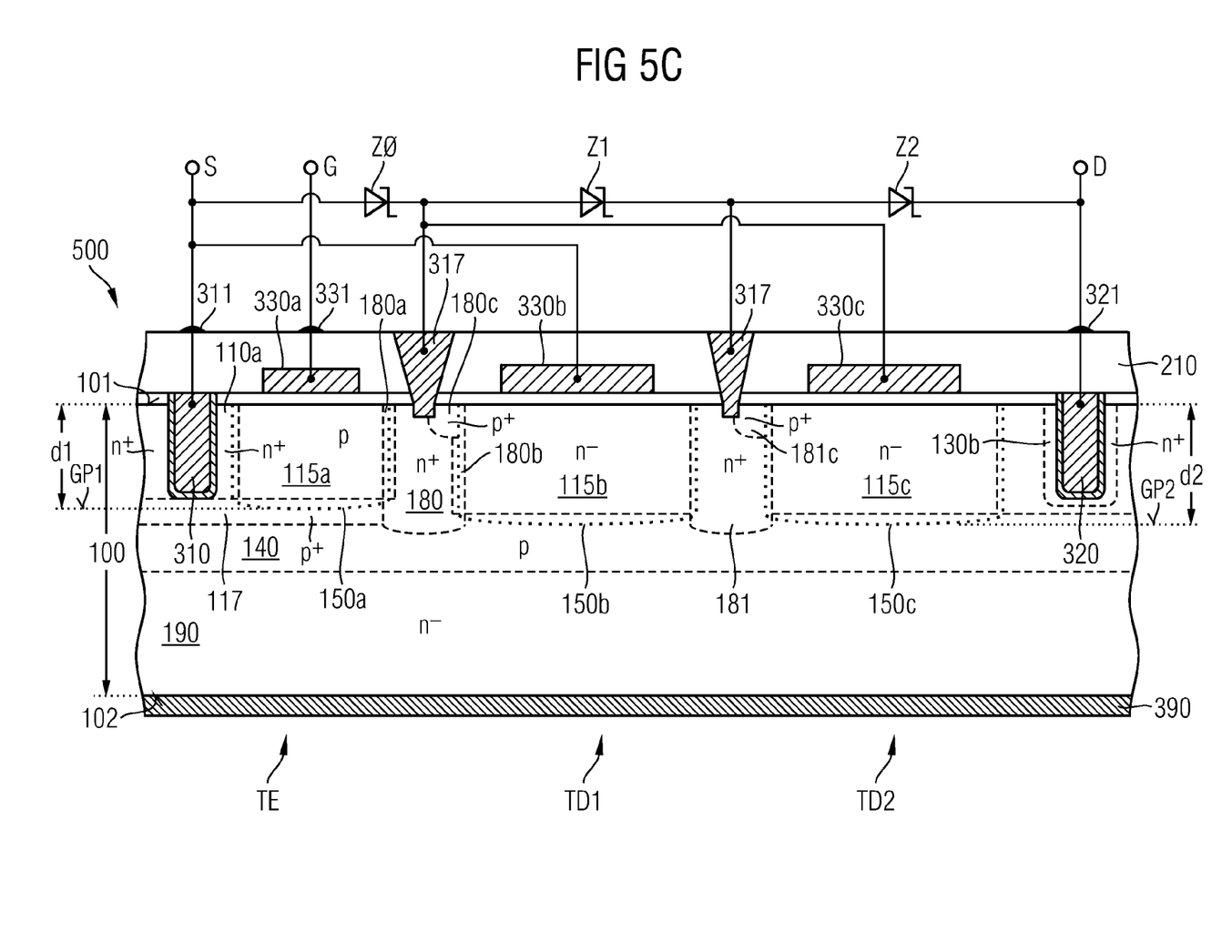
FIG. 5C is a schematic cross-sectional view of the semiconductor device portion of FIG. 5B along line C-C.

The semiconductor device 500 of FIGS. 5A to 5C differs from the semiconductor device 500 of FIG. 4A in that two columns of first depletion FinFET cells TD1 and second depletion FinFET cells TD2 replace the single columns of depletion FinFET cells TD of FIG. 4A.

The first and second depletion FinFET cells TD1, TD2 may differ with respect to the geometric dimensions, configuration and/or material or may have the same geometric dimensions, configuration and may be formed from the same materials. A further connection structure 181 separates second gate structures 150b of the first depletion FinFET cells TD1 from third gate structures 150c of the second depletion FinFET cells TD2. The first connection structure 180 is electrically connected with a third gate wiring line 330c assigned to the second depletion FinFET cells TD. A third Zener diode Z2 or another voltage limiting element may be arranged in parallel to the second depletion FinFET cells TD2. For further details reference is made to the detailed description of FIGS. 4A to 4C, wherein instead of the channel contact zones 180c, 181c the buried body contact zone 117 may directly adjoin the first and second channels zones 115b.

In the blocking state, each of the enhancement and depletion FinFET cell columns dissipates a portion of the applied blocking voltage. When the semiconductor device 500 switches into the conductive state, starting from the enhancement FinFET cells TE the columns of enhancement and depletion transistor cells TE, TD successively switch into the on-state. When the semiconductor device 500 switches to the off-state, starting from the first column including the enhancement FinFET cells TE the columns of enhancement and depletion FinFET cells TE, TD successively switch into the blocking state.

Figure 6:
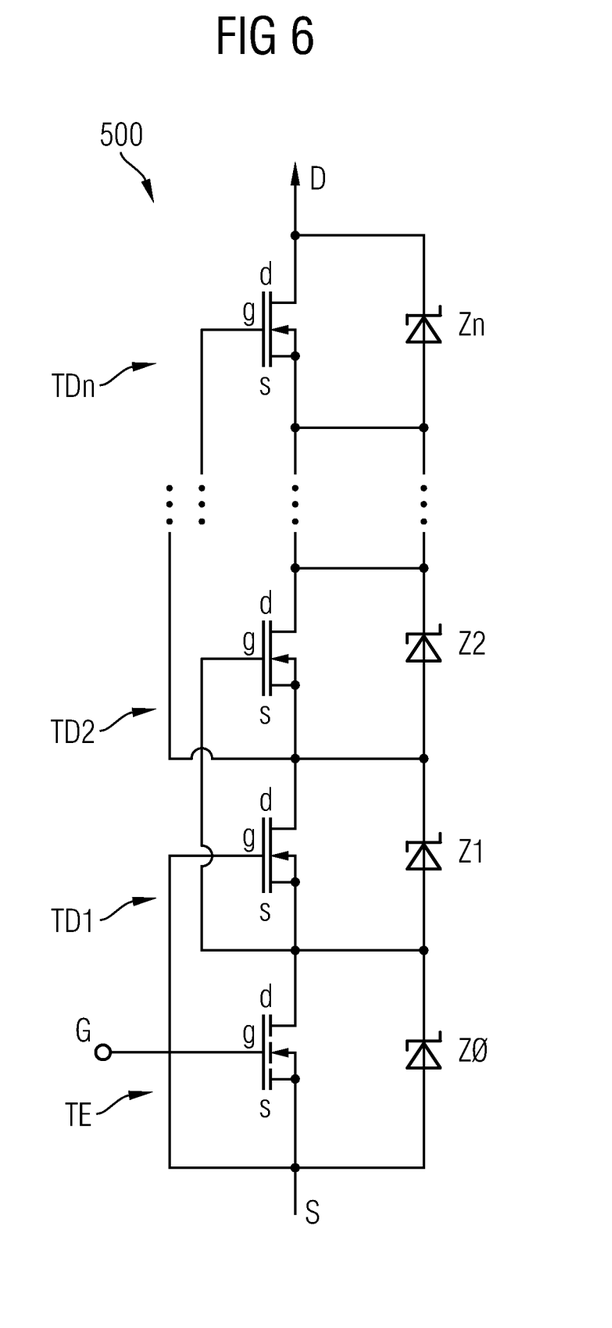
FIG. 6 is a circuit diagram of a semiconductor device in accordance with an embodiment concerning a cascode configuration with more than two depletion FinFET cells.

FIG. 6 shows the circuit diagram of a further semiconductor device 500 with more than two columns of depletion FinFET cells TD1, TD2, TDn. The number n of columns of depletion FinFET cells can be easily adapted to the application requirements, e.g., to the target blocking capability such that devices of different blocking capabilities can be manufactured based on the same lateral layout kernel without grinding and CMP processes thinning the semiconductor portion 100.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   enhancement FinFET (fin field effect transistor) cells comprising first gate structures separating first semiconductor fins;
   depletion FinFET cells comprising second gate structures separating second semiconductor fins; and
   a connection structure arranged between the first and second gate structures and separating the first semiconductor fins from the second semiconductor fins, wherein a specific conductance of the connection structure is higher than in the second semiconductor fins.

2. The semiconductor device of claim 1, wherein the connection structure includes heavily doped semiconducting zones which are effective as drain zones for the enhancement FinFET cells and as source zones for the depletion FinFET cells.

3. The semiconductor device of claim 1, wherein a vertical extension of the connection structure is greater than a vertical extension of the first semiconductor fins.

4. The semiconductor device of claim 1, wherein the connection structure includes a semiconducting zone of the conductivity type of channel zones formed in the second semiconductor fins and an impurity concentration in the semiconducting zone is at least ten times as high as a mean net impurity concentration in the channel zones.

5. The semiconductor device of claim 1, further comprising:
   a metal contact structure directly adjoining the connection structure.

6. The semiconductor device of claim 1, further comprising:
   a transistor wiring electrically connecting a source zone of the enhancement FinFET cells with gate electrodes of the depletion FinFET cells.

7. The semiconductor device of claim 1, further comprising:
   a metal contact structure directly adjoining the connection structure;
   further depletion FinFET cells comprising third gate structures arranged between third semiconductor fins;
   a further connection structure arranged between the second and third gate structures, wherein a specific conductance of the further connection structure is higher than a specific conductance of the third semiconductor fins; and
   a further transistor wiring electrically connecting the contact structure and the third gate structures.

8. The semiconductor device of claim 1, further comprising:
   a first Zener diode that comprises an anode electrically connected to a source zone of the enhancement FinFET cells and a cathode electrically connected with the connection structure.

9. The semiconductor device of claim 1, wherein longitudinal axes of the first gate structures and longitudinal axes of the second gate structures are parallel to a first lateral direction and a longitudinal axis of the connection structure extends in a second lateral direction tilted to the first lateral direction.

10. The semiconductor device of claim 1, wherein the connection structure includes contact zones of a conductivity type opposite to a conductivity type of channel zones formed in the second semiconductor fins, the contact zones directly adjoining portions of the channel zones that directly adjoin the second gate structures.

11. A semiconductor device, comprising:
enhancement FinFET (fin field effect transistor) cells comprising first gate structures arranged between first semiconductor fins;
first depletion FinFET cells comprising second gate structures arranged between second semiconductor fins and electrically connected with a source zone of the enhancement FinFET cells; and
second depletion FinFET cells comprising third gate structures arranged between third semiconductor fins and electrically connected with a source zone of the first depletion FinFET cells.

12. The semiconductor device of claim 11, further comprising:
a first voltage limiting element that comprises a first electrode electrically connected to the source zone of the enhancement FinFET cells and a second electrode electrically connected with a source zone of the first depletion FinFET cells.

13. The semiconductor device of claim 12, further comprising:
a second voltage limiting element that comprises a first electrode electrically connected to the source zone of the first depletion FinFET cells and a second electrode electrically connected with the source zone of the second depletion FinFET cells.

14. The semiconductor device of claim 11, further comprising:
a connection structure arranged between the first and second gate structures, wherein a specific conductance of the connection structure is higher than a specific conductance in the second semiconductor fin.

15. The semiconductor device of claim 14, further comprising:
a further connection structure arranged between the second and third gate structures, wherein a specific conductance of the further connection structure is higher than a specific conductance in the third semiconductor fin.

16. The semiconductor device of claim 14, further comprising:
a metal contact structure directly adjoining the connection structure.

17. The semiconductor device of claim 16, further comprising:
a transistor wiring electrically connecting the metal contact structure with third gate electrodes comprised in the third gate structures.

18. The semiconductor device of claim 11, wherein
the first gate structures are arranged in first columns, the second gate structures in second columns and the third gate structures in third columns, wherein the second column is arranged between the first column and the third column.

19. The semiconductor device of claim 18, further comprising:
a connection structure arranged between the first and the second column and a further connection structure between the second and the third columns.

* * * * *